(12) United States Patent
Eby et al.

(10) Patent No.: US 6,838,159 B2
(45) Date of Patent: Jan. 4, 2005

(54) HIGH TRANSMITTANCE, LOW EMISSIVITY COATINGS FOR SUBSTRATES

(75) Inventors: Eric Eby, Spring Green, WI (US); Roger O'Shaughnessy, Chaska, MN (US); Robert Bond, Spring Green, WI (US)

(73) Assignee: Cardinal Glass Industries, Inc., Eden Prairie, MN (US)

( * ) Notice: Subject to any disclaimer, the term of this patent is extended or adjusted under 35 U.S.C. 154(b) by 0 days.

(21) Appl. No.: 10/339,519

(22) Filed: Jan. 9, 2003

(65) Prior Publication Data

US 2003/0104220 A1 Jun. 5, 2003

Related U.S. Application Data

(60) Continuation of application No. 09/898,545, filed on Mar. 11, 1997, now Pat. No. 6,524,688, which is a continuation of application No. 08/611,287, filed on Jun. 3, 1996, now abandoned, which is a continuation of application No. 08/440,396, filed on May 12, 1995, now abandoned, which is a continuation of application No. 08/191,583, filed on Feb. 3, 1994, now abandoned, which is a division of application No. 07/859,576, filed on Mar. 27, 1992, now Pat. No. 5,302,449.

(51) Int. Cl.[7] ................................................ G02B 5/28
(52) U.S. Cl. ...................... 428/216; 359/359; 428/336; 428/432; 428/433; 428/472; 428/697; 428/701; 428/702
(58) Field of Search ................................ 428/216, 336, 428/433, 472, 701, 702, 697; 359/359

(56) References Cited

U.S. PATENT DOCUMENTS

| | | | |
|---|---|---|---|
| 3,519,339 A | 7/1970 | Hutchinson et al. | 359/359 |
| 3,649,359 A | 3/1972 | Apfel et al. | 359/580 |
| 3,682,528 A | 8/1972 | Apfel et al. | 350/166 |
| RE27,473 E | 9/1972 | Mauer | 428/432 |
| 3,758,185 A | 9/1973 | Gelber | 350/164 |
| 3,889,026 A | 6/1975 | Groth | 428/34 |
| 3,978,272 A | 8/1976 | Donley | 428/434 |
| 3,990,784 A | 11/1976 | Gelber | 428/432 |
| 4,017,661 A | 4/1977 | Gillery | 428/412 |
| 4,045,125 A | 8/1977 | Farges | 359/585 |
| 4,179,181 A | 12/1979 | Chang | 350/1 |
| 4,337,990 A | 7/1982 | Fan et al. | 350/1 |
| 4,368,945 A | 1/1983 | Fujimori et al. | 350/1 |
| 4,413,877 A | 11/1983 | Suzuki et al. | 350/1 |
| 4,419,386 A | 12/1983 | Gordon | 427/109 |
| 4,462,883 A | 7/1984 | Hart | 204/192 |

(List continued on next page.)

FOREIGN PATENT DOCUMENTS

| | | | |
|---|---|---|---|
| AU | 554729 | | 12/1985 |
| EP | 0304234 | | 2/1989 |
| EP | 0 332 717 | * | 9/1989 |
| FR | 1513724 | | 2/1968 |
| GB | 1270586 | | 4/1972 |
| JP | 63-239043 | * | 10/1988 |
| JP | 02-111644 | * | 4/1990 |
| JP | 63-110507 | * | 5/1998 |
| WO | 9005439 | | 5/1990 |
| WO | 9008334 | | 7/1990 |

*Primary Examiner*—Archene Turner
(74) *Attorney, Agent, or Firm*—Fredrikson & Byron, PA

(57) ABSTRACT

The present invention provides a coating for a transparent substrate which exhibits a "neutral" color through a wide range of angles of incidence of light. The coating employs a base coat adjacent the transparent substrate having a thickness of no more than about 275 Å and may include two reflective metal layers having an intermediate layer of an anti-reflective metal oxide therebetween and an outer anti-reflective layer of metal oxide over the second reflective metal layer. If so desired, the coating of the invention may include an abrasive-resistant overcoat as its outermost layer. This overcoat is desirably formed of an abrasive-resistant metal oxide, such as zinc oxide applied at a thickness which does not significantly affect the optical properties of said coated substrate.

20 Claims, 1 Drawing Sheet

U.S. PATENT DOCUMENTS

| | | | |
|---|---|---|---|
| 4,497,700 A | 2/1985 | Groth et al. | 428/432 |
| 4,512,863 A | 4/1985 | Criss et al. | 204/192 |
| 4,532,181 A | 7/1985 | Brill et al. | 428/336 |
| 4,556,277 A | 12/1985 | Fan et al. | 350/1 |
| 4,563,400 A | 1/1986 | Criss et al. | 428/630 |
| 4,594,137 A | 6/1986 | Gillery et al. | 204/192 |
| 4,639,069 A | 1/1987 | Yatabe et al. | 350/1 |
| 4,716,086 A | 12/1987 | Gillery et al. | 428/630 |
| 4,786,563 A | 11/1988 | Gillery et al. | 428/432 |
| 4,786,783 A | 11/1988 | Woodard | 219/547 |
| 4,786,784 A | 11/1988 | Nokodem et al. | 219/543 |
| 4,799,745 A | 1/1989 | Meyer et al. | 350/1 |
| 4,859,532 A | 8/1989 | Oyama et al. | 428/336 |
| 4,891,113 A | 1/1990 | Criss | 204/192 |
| 4,898,789 A | 2/1990 | Finley | 428/623 |
| 4,902,580 A | 2/1990 | Gillery | 428/623 |
| 4,902,581 A | 2/1990 | Criss | 428/427 |
| 4,943,484 A | 7/1990 | Goodman | 428/472 |
| 4,965,121 A | 10/1990 | Young et al. | 428/213 |
| 4,996,105 A * | 2/1991 | Oyama et al. | |
| 5,028,759 A | 7/1991 | Finley | 219/203 |
| 5,073,451 A | 12/1991 | Iida et al. | 428/336 |
| 5,296,302 A | 3/1994 | O'Shaughnessy et al. | |
| 5,302,449 A * | 4/1994 | Eby et al. | |
| 5,332,888 A * | 7/1994 | Tausch et al. | |
| 5,532,062 A * | 7/1996 | Miyazaki et al. | |
| 6,524,688 B1 * | 2/2003 | Eby et al. | |

* cited by examiner

HIGH TRANSMITTANCE, LOW EMISSIVITY COATINGS FOR SUBSTRATES

CROSS REFERENCE TO RELATED APPLICATIONS

This patent application claims priority to and is a continuation application of U.S. application Ser. No. 09/898,545, filed on Mar. 11, 1997 now U.S. Pat. No. 6,524,688, which is a continuation application of U.S. application Ser. No. 08/611,287, filed on Jun. 3, 1996 now abandoned, which is a continuation application of U.S. application Ser. No. 08/440,396, filed on May 12, 1995 now abandoned, which is a continuation application of U.S. application Ser. No. 08/191,583, filed on Feb. 3, 1994 now abandoned, which is a divisional application of U.S. application Ser. No. 07/859,576, filed on Mar. 27, 1992 now U.S. Pat. No. 5,302,449, and of which the entire contents of each is hereby incorporated by reference herein.

FIELD OF THE INVENTION

The present invention generally relates to coatings for substrates and particularly to substantially trans coatings for transparent substrates such as glass.

BACKGROUND OF THE INVENTION

High visible transmittance, low emissivity coatings applied to transparent substrates such as glass are characterized by their ability to transmit visible light while minimizing the transmittance of other wavelengths of light, such as light in the infrared spectrum. This characteristic is particularly useful for reducing radiative heat transfer without impairing visibility, such as in architectural glass or automobile windows. For aesthetic reasons, in many such applications it is important to maintain reflection relatively consistent throughout the visible spectrum so that the coating has a "neutral" color, i.e., is essentially colorless.

Generally speaking, such high transmittance, low emissivity coatings comprise a "film stack" having at least one thin metallic film or layer with high infrared reflectance and low transmissivity disposed between metal oxide layers. The metallic layer may be virtually any reflective metal, such as silver, copper or gold, with silver being the most frequently-used metal for this application due to its relatively neutral color. Metal oxides are useful in high transmittance, low emissivity films including oxides of titanium, hafnium, zirconium, niobium, zinc, bismuth, indium and tin. Prior art systems have also employed oxides of metal alloys, such as zinc stannate or oxides of indium/tin alloys.

The metal oxide layers of such coatings serve two important functions. First, they serve to reduce the visible reflection of the film stack, enhancing transmittance. The metal oxides used in these layers should have a relatively high index of refraction, e.g., on the order of 2.0 or more, in order to achieve this end. According to commonly accepted principles in the art, the metal oxide layer between the transparent (e.g., glass) substrate and the first metallic layer must be at least 300 Angstroms (Å) in order to obtain a neutral, high transmitting coating; such layers more commonly are between about 400 and 700 Å in thickness.

Second, the metal oxide layers should serve to protect the reflective metal layer from the environment. Once such coated substrates are assembled and installed for use, the film stack is frequently isolated from contact with the environment, as by disposing the film stack between two spaced panes of glass in a composite window structure. However, before these products, are assembled, the film stack is frequently subjected to relatively harsh conditions, such as by handling, shipping or washing.

A variety of attempts have been made to enhance the ability of the metal oxide layers to protect the reflective metal layer in such film stacks. For instance, Gillery, et al. teach the use of titanium oxide as a protective overcoat in U.S. Pat. No. 4,786,563, the teachings of which are incorporated herein by reference. Although Gillery, et al. explain that titanium oxides achieve the best results, they note that such an overcoat could be formed of a metal instead of a metal oxide; titanium and alloys of iron or nickel are listed as prime candidates for such a metal layer. Gillery, et al. ado teach that certain other oxides simply lack the requisite durability to be used as a protective overcoat. Zinc oxide, bismuth oxide and tin oxide are all listed as having undesirable properties, such as a lack of durability, which make them unsuitable for a protective overcoat.

However, it has been found that the use of a titanium oxide overcoat such as that taught by Gillery, et al. is particularly prone to scratching or abrasion during shipping and washing operations. For instance, when coated substrates are washed before being assembled into a final product, the film stack comes into physical contact with a washing apparatus. It has been found that such a washing stage can physically abrade an overcoat of titanium oxide or the like, noticeably degrading the appearance of the finished article.

The particular composition of the layers of a film stack, as well as their relative thicknesses, must be carefully chosen in order to achieve the desired properties in the coated substrate. As noted above, in addition to maximizing visible transmittance while minimizing emissivity, in many instances it is desirable that a film stack have a neutral color. It has been possible to provide coatings for substrates which have an acceptable neutral color in transmission when viewed at an angle of incidence generally perpendicular to the plane of the film. However, as the angle of incidence is decreased, the film stack will tend to exhibit increasing color in transmission. It has been noted that when film stacks which are nearly completely neutral when viewed at a perpendicular angle will tend to exhibit a distinct, visible color when viewed at a more acute angle. Windows of buildings or cars are viewed from various angles, of course, so variations in color of film. stacks can frequently be detected in use.

It would be desirable to provide a film stack which serves as a high visible transmittance, low emissivity coating for a substrate, yet remains substantially neutral at a wide range of angles of incidence. Additionally, it would be desirable to provide the film stack with a protective coating which can withstand the rigors of normal handling associated with such substrates.

SUMMARY OF THE INVENTION

The present invention provides a high transmittance, low emissivity film stack having a base coat formed of a metal oxide which is desirably no more than about 275 Angstroms thick. This thickness is generally considered in the prior, art to be too thin to provide the necessary antireflection between the substrate and the overlying reflective metal layer. We have found, unexpectedly, that a metal oxide base coat formed at thickness of 275 Å and below can adequately serve its antireflective function. In addition to having obvious economic benefits due to the reduction in materials and energy necessary to apply the base coat, reducing the base coat in accordance with the present invention has surprisingly been found to achieve significant improvements in the color neutrality of the film stack. In particular, this relatively thin base coat enables construction of a film stack that exhibits a neutral color at a much wider range of angles-of incidence than commonly associated with prior art film stacks.

In another embodiment of the present invention, a film stack including a thin base coat of the invention also includes an outer layer of an oxide of a metal chosen from the group of zinc, tin, indium, or bismuth, or an alloy including such a metal. This overcoat layer is applied at a thickness which will not substantially affect the optical properties of the, coated substrate if the overcoat is damaged or rubbed off. It has been found that a film stack which includes an overcoat according to this embodiment exhibits significantly enhanced physical durability as compared to a film stack without such an overcoat.

DETAILED DESCRIPTION OF THE PREFERRED EMBODIMENTS

Figure 1:
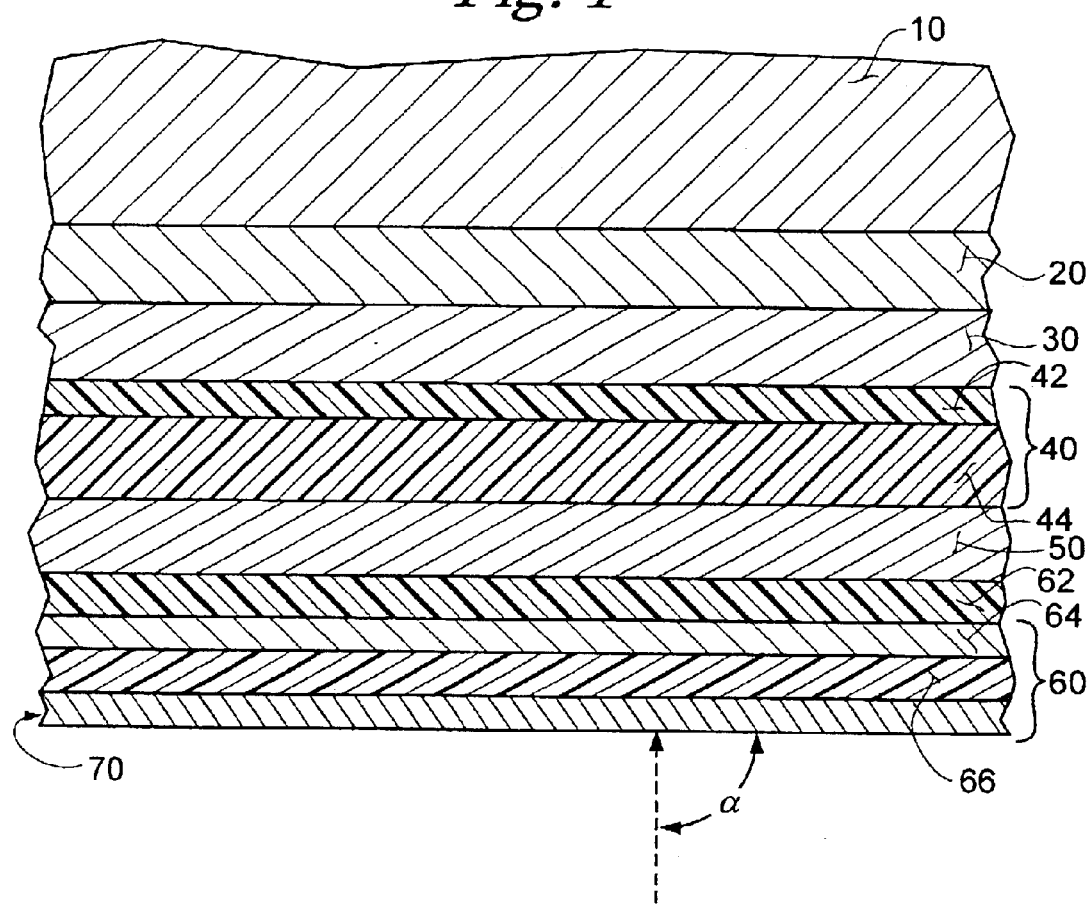
FIG. 1 is a schematic view of a substrate coated with a film stack of one embodiment of the present invention.

A schematic representation of one preferred embodiment of a high transmittance, low emissivity film of the invention is shown in FIG. 1. The film stack of the invention is applied over a substrate 10, which may be of any desired material. It is contemplated that a film stack of the invention, though, will be applied to a substantially transparent substrate, such as glass or a clear plastic material. The present invention has particular utility in coating glass panes for use as windows in architectural or automobile-related applications.

A base coat 20 of a metal oxide of the invention is applied over the substrate. It is contemplated that the metal oxide of this base coat 20 be at least about 150 Å thick, but should be no more than about 275 Å thick. A thickness of approximately 220 Å is preferred for this layer.

Metal oxide layers analogous to base coat 20 of the present invention employ known metal oxides such as titanium oxide, hafnium oxide, zirconium oxide, zinc oxide, tin oxide, indium oxide, and bismuth oxide, as well as combinations of such oxides. These oxides are deposited by magnetron sputtering. Magnetron sputtering techniques are well known in the art and need not be discussed in detail here.

Although any one of the aforementioned metal oxides are useful for base coat purposes, the thickness of the base coat may vary depending upon which of those metal oxides is chosen. If a metal oxide having a relatively low index of refraction (2.0 for zinc oxide) is used, a base coat thickness of between about 150 Angstroms and about 275 Angstroms is preferred. This yields a desired optical thickness (the product of actual thickness and refractive index) of between about 300 Angstroms and about 550 Angstroms. If a material having a higher index or refraction, is used, the actual thickness of the base coat 20 may be reduced while still maintaining the same desired optical thickness; if titanium oxide, which may have an index of refraction of about 2.3–2.6, with about 2.4 being most common, is used, the preferred thickness of the base coat 20 is between about 125 and about 230 Å, which yields about the same optical thickness as that supplied by about 150–275 Å of zinc oxide.

As mentioned above, a film stack of the present invention also includes a reflective metal layer 30 applied over the base coat 20. Any suitable metal layer which effectively reflects infrared radiation without significantly affecting visible transmittance is suitable for this metal layer. Although gold or copper could be used, as noted above, silver is preferred because color neutrality of the film stack can be more readily achieved. In the embodiment shown, in which two discrete reflective metal layers are employed as described below, a desirable inner (nearest the substrate) reflective metal layer 30 has a thickness on the order of about 100 to about 150 Å, with a thickness of approximately 125 Å being preferred. However, a film stack of the invention may include only a single reflective metal layer, omitting layers 40–50 of FIG. 1. In such a single metal layer film stack, a layer of silver is preferably applied at a thickness of about 100 to about 175 Å, with a thickness of approximately 140 Å being particularly preferred.

In the embodiment shown in FIG. 1, an outer reflective metal layer 50 is also included. As is known in the art, it is desirable to include an intermediate layer 40 disposed between the inner and outer reflective metal layers (30, 50, respectively). The intermediate layer 40 may be of any desirable composition; metal oxides which have been found to work well for such an intermediate layer are substantially the same as those which have proven effective for the inner metal oxide layer 20 set forth above.

In the preferred embodiment shown in FIG. 1, the silver layer is overcoated with a sacrificial layer 42 of a metal such as titanium which is oxidized as the next oxide coating in sequence is applied. The metal layer 42 thus serves as a sacrificial layer to protect the underlying reflective layer 30 during the sputtering of the metal oxide layer 44. Applying the titanium metal at a thickness of approximately 20 Å been found to work well.

The metal oxide layer 44 may be formed of any suitable metal oxide, such as an oxide of zinc, tin, indium or bismuth. According to one preferred embodiment of the present invention, the thickness of the intermediate metal oxide layer 44 is at least about 3 times that of the base coat 20, i.e., the ratio of the thicknesses of the base coat 20 to the intermediate layer 40 is no more than about 0.33. For example, in a film stack of the invention having a base coat 20 with a thickness of approximately 220 Å, it is preferred that the intermediate layer 40 be between about 660 and about 900 Å thick, with a range of about 700 to about 750 Å being preferred. This yields a ratio of the thickness of the base coat 20 to that of the second metal oxide layer 44 of between about 0.33 and about 0.24, with a preferred range of about 0.31 (220 divided by 700) and about 0.29 (220 divided by 750).

In the embodiment schematically depicted in FIG. 1, an outer reflective metal layer 50 is also employed. The metal of this reflective layer may be the same as or different from the metal used in the inner reflective metal layer 30. The thickness of this second reflective metal layer should be selected such that the combined action of the inner and outer reflective metal layers achieves the desired visible transmittance and emissivity properties, as well as the color properties, for the film stack. With an inner reflective layer 30 of approximately 125 Å, is it preferred that the outer reflective layer 50 be between about 125 and about 175 thick, with a thickness of approximately 150 Å being preferred. Using such thicknesses for the inner and outer metal layers 30, 50 has been found to achieve rather low emissivity while maintaining relatively high visible transmittance and color neutrality. An outer metal oxide layer 60 is applied over the outer reflective metal layer 50. It should be understood that this outer metal oxide layer 60 is employed regardless of the number of reflective metal layers utilized in the film stack. For example, if only a single reflective metal layer, such as layer 30 in FIG. 1, is employed, the outer oxide layer 60 may be applied directly over that metal layer. Alternatively, if additional reflective metal layers were to be employed, such as in a film stack which employs 3 or more reflective metal layers, the outer metal oxide layer 60 should be applied over the outermost of the reflective metal layers.

An outer metal oxide layer 60 according to the present invention may be of any suitable construction. In a preferred embodiment, the outer metal oxide layer 60 is formed over a barrier layer 62 applied directly to the metal layer 50, with one or more additional oxide layers being carried above the barrier, layer. This barrier layer 62 may be substantially similar to the barrier layer 42 described above in connection with the intermediate metal oxide layer 40.

The outer metal oxide layer 60 desirably includes at least 1 metal oxide layer carried over the barrier layer 62 in order to minimize ensure the visible reflectance of the film stack and protect the integrity of the underlying metal layer or layers. This metal oxide carried over the barrier layer maybe varied in composition and thickness to meet the specific performance parameters desired for the film stack. For instance, a single layer of an oxide of titanium may be employed. However, in the preferred embodiment shown in FIG. 1, at least two metal oxide layers 64, 66 are disposed above the barrier layer 62.

It is desirable to form the first and second layers 64, 66 of different metal oxides rather than forming both layers of the same composition. One of the two layers 64, 66 preferably comprises an oxide of titanium, hafnium, zirconium or niobium or an alloy of such a metal, with titanium oxide being particularly preferred. Such a layer provides additional chemical resistance to the film stack, protecting the underlying metal layers from the attack of chemical agents. The thickness of this layer can be varied within a relatively broad range. It is preferred that this layer be at least about 5–10 Å thick in order to achieve an effective chemical barrier, but this layer can be increased significantly beyond that minimum thickness. Titanium, hafnium, zirconium and niobium sputter relative slowly and oxide layers of such metals therefore tend to be relatively expensive to apply. It is therefore economically desirable to apply such an oxide layer at a thickness of no more than about 100 Å. In a preferred embodiment, this layer is formed of titanium oxide at a thickness of a between about 50 Å and 100 Å, with about 55–60 Å being particularly preferred.

The other of the two metal oxide layers 64, 66 and the outer layer 60 may be formed of any desired metal oxide. It has been found that zinc oxide, tin oxide, indium oxide and bismuth oxide work quite well in this application. In one preferred embodiment, this layer is formed of zinc oxide at a thickness of between about 200 Å and about 400 Å, with a thickness of about 300 Å being preferred. Although the relative order of the titanium oxide and zinc oxide layers may be varied, in this embodiment zinc oxide is applied over a titanium oxide barrier layer 62 as oxide layer 64 and titanium oxide is applied over the zinc oxide layer as oxide layer 66.

It is also desirable to minimize the total thickness of this film stack. It is believed that minimizing the total thickness of this film stack, in combination with the use of a relatively thin base coat 20 as described above, helps achieve a wider range of angles of incidence displaying a neutral color, as described more fully below. It is contemplated that the total thickness of this film stack be no more than approximately 1700 Å, with a total thickness of about 1600 Å being preferred and a thickness of between about 1500–1600 Å being particularly preferred.

Although the use of an inner metal oxide layer is well known, it is generally accepted that effective high visible transmittance, low emissivity films having a neutral color require an inner metal oxide layer at least 300 Å thick. As noted above, the inner metal oxide layer is disposed between the substrate and the overlying reflective metal layer 30. A thickness of at least about 300 Å has been thought necessary to reduce reflection as light passes from the substrate to the reflective metal layer or vice-versa.

We have discovered that adequate antireflection can be obtained using a significantly thinner base coat 20. Clearly, using less of the metal oxide material in forming this base coat will reduce the costs associated with producing the coated substrate—not only are the costs of the raw materials reduced, but the power requirements and manufacturing time necessary in applying such films are also correspondingly reduced. Quite surprisingly, though, using less metal oxide material in the base coat does not significantly reduce the optical properties of the coated substrate as commonly accepted principles in the art would suggest. To the contrary, the use of a base coat according to the present invention has been found to actually improve the optical properties, particularly the color neutrality, of the resulting film stack.

As noted briefly above, it is important that coated substrates used in certain applications exhibit a neutral color. Much effort has been devoted to selecting appropriate metal oxide and metal layers to achieve a film stack having a neutral color. Colors of coated substrates are routinely measured by using light which strikes the coated substrate at an angle substantially perpendicular to the glass pane. In performing such a test, a light source having a known wavelength distribution over the visible spectrum is positioned on one side of the coated substrate and a detector is positioned on the other side of the substrate along a line which is substantially perpendicular to the surface of the substrate. The detector then measures the light intensity at various wavelengths across the visible spectrum and compares these measurements to the known wavelength distribution of the source to determine the overall "neutrality" of the coated substrate. Such color tests are well known in the art and need not be explained in detail here.

It is important to note, though, that such tests are designed to measure the color of light transmitted through the substrate at an angle substantially perpendicular to its surface. As the angle of incidence at which light strikes the film (alpha in FIG. 1) is reduced from 90°, the color of the coated substrate can change. Although this change can be quite difficult to quantify with current testing techniques, it has been noted by those experienced in this field that this change can be quite significant. In particular, some coatings which have exhibited superior neutrality when measured with light at a normal angle of incidence have shown distinct, visible color, e.g., a yellowish tint, when viewed at a more acute angle of incidence.

However, in a coated substrate of the present invention the film stacks substantially retain their neutrality over a wide range of angles of incidence, e.g., at angles up to about 45°.

In an additional embodiment of the present invention, the base coat 20, reflective metal layers 30, 50, and the intermediate metal oxide layer 40 are substantially described above. However, according to this embodiment the outer metal oxide layer 60 of the invention includes an outer overcoat 70 applied as the outermost layer of the film stack, i.e., any location disposed farthest away from the base coat 20. The overcoat 70 is adapted to protect the underlying layers of the film stack from abrasions. In many instances, a substrate is coated at one location and must then be shipped to another location for assembly into a final product. For instance, glass panes may be provided with a high transmittance, low emissivity coating at a coating facility and then be shipped to another remote facility for assembly to insulative glass window units. Although it is possible to ship coated substrates relatively short distances without unduly damaging coatings, when the substrates are shipped over long distances the product losses due to abrasion can be quite high.

For example, a glass product provided with a coating substantially as outlined above and including titanium oxide as an outermost layer was transported from a coating facility to an assembly plant less than 1,000 miles away; nearly 80% of the shipment was considered to be unacceptable for use in insulative glass units because of scratching and abrading of the coatings. By applying an overcoat of the invention to a second shipment of glass provided with substantially the same film stack, though, the number of unacceptably coated panes was comparable to that associated with very short-range shipping and was within acceptable, expected ranges of manufacturing losses. This second shipment of glass including an overcoat showed very few scratches or other abrasions and were visibly better than the prior shipment which omitted the overcoat.

The instant overcoat 70 desirably is formed of a material with a greater mechanical durability, i.e., a material which better resists abrasion or scratching, than the material immediately underlying this overcoat. Materials which exhibit relatively high mechanical durability when sputtered on as an overcoat of the invention include oxides of zinc, tin, indium, bismuth, or oxides of alloys including such metals, such as zinc stannate. Due to its relatively low cost and high sputtering rate, zinc oxide applied by magnetron sputtering of a zinc target in a reactive oxygen atmosphere is particularly preferred.

Unfortunately, though, it has been found that such mechanically durable metal oxide layers tend to be more susceptible to chemical attack than other more conventional outer layers such as titanium oxide. When coated glass pane are handled by workers assembling final glass products, the workers often touch the film stack. Sweat on the workers' hands or chemicals used in the assembly process may contact the film stack and can visibly mottle or otherwise degrade the film. Additionally, such panes are frequently washed before assembly; the chemicals in the washing solutions can also adversely affect the film.

Therefore, it is desirable to apply an overcoat 70 of the invention at a thickness which does not substantially affect the optical properties, and particularly the color, of the coated substrate. If a film stack of the invention is subjected to a harsh chemical environment which degrades the overcoat, the effects on the overcoat will not significantly affect the optical properties of the film or the coated substrate. Even if the washing process were so harsh as to wash away the entire overcoat from the film stack, the optical properties of the film would not be substantially changed, but the overcoat would nonetheless serve to protect the underlying film from abrasion during handling, shipping or the like prior to washing.

The thickness at which an overcoat of the invention is applied will vary according to the metal oxide used; the maximum thickness of the overcoat will be less for materials with a relatively high index of refraction than for metals with a relatively low index of refraction. It has been found that an overcoat having an optical thickness of between about 10 Å and about 40 Å can provide suitable abrasion resistance without significantly affecting the optical properties. Thus, an overcoat of zinc oxide, which has an index of refraction of very near 2.0, is advantageously applied at about 5 Å to about 20 Å thick.

While a preferred embodiment of the present invention has been described, it should be understood that various changes, adaptations and modifications may be made therein without departing from the spirit of the invention and the scope of the appended claims.

What is claimed is:

1. A high transmittance, low emissivity coated substrate comprising a coating providing the coated substrate with a substantially neutral color over a wide range of angles of incidence, the coating comprising:
    (a) a base coat of an anti-reflective metal oxide having a refractive index of about 2.0 or more applied to a surface of said substrate at an optical thickness of no more than about 550 Å;
    (b) a first reflective metal layer applied over said base coat;
    (c) an intermediate anti-reflective layer applied over said first reflective metal layer, the ratio of thickness of the base coat to the thickness of the intermediate layer being no more than about 0.33;
    (d) a second reflective metal layer applied over said intermediate anti-reflective layer; and
    (e) an outer anti-reflective layer applied over said second reflective metal layer;
    wherein the coating has a total thickness of about 1700 Å or less.

2. The coated substrate of claim 1 further comprising an abrasion-resistant overcoat as an outermost layer of the coating, the overcoat being formed of a material having greater mechanical durability than the immediately underlying layer.

3. The coated substrate of claim 1 further comprising an abrasion-resistant overcoat as an outermost layer of the coating, the overcoat being formed of an oxide of a metal selected from the group consisting of zinc, tin, indium, bismuth and combinations thereof.

4. The coated substrate of claim 1 wherein the coated substrate retains the substantially neutral color at angles of incidence of up to about 45°.

5. The coated substrate of claim 1 wherein the basecoat has an optical thickness of about 300 Å to 550 Å.

6. The coated substrate of claim 1 wherein the total thickness of the coatings is about 1600 Å or less.

7. The coated substrate of claim 6 wherein the total thickness of the coating is between about 1500–1600 Å.

8. A high transmittance, low emissivity coated substrate comprising a coating providing the coated substrate with a substantially neutral color, the coating comprising:
    (a) a base coat of an anti-reflective metal oxide having a refractive index of about 2.0 or more applied to a surface of said substrate at an optical thickness of no more than about 550 Å;
    (b) a reflective metal layer applied over said base coat;
    (c) an anti-reflective layer applied over the reflective metal layer, the ratio of the thickness of the base coat to the thickness of the anti-reflective layer being no more than about 0.33; and (d) an abrasion-resistant overcoat as outermost layer of the coating, the overcoat being formed of an oxide of a metal selected from the group consisting of zinc, tin, indium, bismuth and alloys including such metals, the overcoat being applied at a thickness which does not substantially affect the optical properties of the coating;

wherein the coating has a total thickness about 1700 Å or less.

9. The coated substrate of claim 8 wherein the overcoat is formed of zinc oxide.

10. The coated substrate of claim 8 wherein the zinc oxide is applied at a thickness of between about 5 Å and about 20 Å.

11. The coated substrate of claim 7 wherein the metal oxide of the overcoat is applied at an optical thickness of between about 10 Å and about 40 Å.

12. The coated substrate of claim 7 wherein the coated substrate retains the substantially neutral color at angles of incidence of up to about 45°.

13. The coated substrate of claim 7 wherein the base coat has an optical thickness of about 300 Å to 550 Å.

14. The coated substrate of claim 7 wherein the total thickness of the coating is about 1600 Å or less.

15. The coated substrate of claim 7 wherein the total thickness of the coating is between 1500 Å and 1600 Å.

16. A high transmittance, low emissivity coated substrate comprising a glass pane bearing a coating providing the coated substrate with a substantially neutral color over a wide range of angles of incidence, the coating comprising:

(a) a base coat of an anti-reflective metal oxide having a refractive index of about 2.0 or more applied to a surface of said substrate at an optical thickness of no more than about 550 Å;

(b) a first reflective metal layer applied over said base coat;

(c) an intermediate anti-reflective layer applied over said first reflective metal layer, the ratio of the thickness of the base coat to the thickness of the intermediate anti-reflective layer no more than about 0.33;

(d) a second reflective metal layer applied over said intermediate anti-reflective layer; and (e) an outer anti-reflective layer applied over said second reflective metal layer;

wherein the coating is about 1700 Å or less.

17. The coated substrate of claim 16 wherein the coated substrate retains the substantially neutral color at angles of incidence of up to about 45°.

18. The coated substrate of claim 16 wherein the base coat has an optical thickness of about 300 Å to 550 Å.

19. The coated substrate of claim 16 wherein the total thickness of the coating is about 1600 Å or less.

20. A high transmittance, low emissivity coated substrate comprising a coating providing the coated substrate with a substantially neutral color over a wide range of angles of incidence, the coating comprising:

(a) a base coat of an anti-reflective metal oxide having a refractive index of about 2.0 or more applied to a surface of said substrate at an optical thickness of about 300 Å to 550 Å;

(b) a first reflective metal layer applied over said basecoat;

(c) an intermediate anti-reflective layer applied over said first reflective metal layer the ratio of thickness of the base coat to the thickness of the intermediate layer being no more than about 0.33;

(d) a second reflective metal layer applied over said intermediate anti-reflective layer; and (e) an outer anti-reflective layer applied over said second reflective metal layer;

wherein the coating has a total thickness of about 1700 Å or less.

* * * * *